(12) United States Patent
Cheng

(10) Patent No.: US 7,429,783 B2
(45) Date of Patent: Sep. 30, 2008

(54) IMAGE SENSOR PACKAGE

(75) Inventor: Ming-Hsiang Cheng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/616,287

(22) Filed: Dec. 27, 2006

(65) Prior Publication Data
US 2007/0200212 A1 Aug. 30, 2007

(30) Foreign Application Priority Data
Feb. 24, 2006 (TW) ............... 95106405 A

(51) Int. Cl.
*H01L 23/02* (2006.01)
(52) U.S. Cl. ............... 257/678; 257/704; 257/723
(58) Field of Classification Search ............. 257/678, 257/704, 723
See application file for complete search history.

(56) References Cited
U.S. PATENT DOCUMENTS

| | | | | |
|---|---|---|---|---|
| 6,683,795 B1* | 1/2004 | Yoo | | 361/816 |
| 6,952,046 B2* | 10/2005 | Farrell et al. | | 257/678 |
| 7,105,904 B2* | 9/2006 | Choi | | 257/432 |
| 2005/0048692 A1* | 3/2005 | Hanada et al. | | 438/106 |
| 2007/0145569 A1* | 6/2007 | Hsin | | 257/700 |

\* cited by examiner

*Primary Examiner*—Roy K Potter
(74) *Attorney, Agent, or Firm*—Jianq Chyun IP Office

(57) ABSTRACT

An image sensor package includes a substrate, a lens module and a bottom cover. Herein the substrate has an upper surface and a lower surface, a plurality of passive components is fabricated on the lower surface and a chip is disposed on the upper surface. The lens module is mounted on the substrate and covers the chip. The bottom cover is connected to the lower surface of the substrate to enclose the passive components.

18 Claims, 5 Drawing Sheets

IMAGE SENSOR PACKAGE

CROSS-REFERENCE TO RELATED APPLICATION

This application claims the priority benefit of Taiwan application Ser. No. 95106405, filed on Feb. 24, 2006. All disclosure of the Taiwan application is incorporated herein by reference.

BACKGROUND OF THE INVENTION

1. Field of the Invention

The present invention generally relates to an image sensor package, and more particular, to an image sensor package applied in a CMOS camera module (CCM), wherein the unflatness problem caused by the passive components disposed on the lower surface of the substrate in the image sensor package is solved by disposing a bottom cover.

2. Description of Related Art

Computers, handsets, digital cameras and liquid crystal displays are indispensable in the modern people life, but none of them is a product not related to the semiconductor industry. In terms of the peripheral products related to the semiconductor industry, the products are more numerous and various that demonstrates the solid potential and significant importance of the electronic industry. In recent years, along with the rapid increasing demands of customers on the electronic product function, the multifunction, the portability and the light-handiness, the package process manufacturers have switched the process direction from the conventional technology into the high precision process featuring high power, high density, lightness, thinness and miniaturization. In addition to the above-mentioned trend, an electronic package also needs to keep the basic characteristics, such as high reliability, good heat dissipation and low manufacturing cost, so as to confront the challenge of the time urgency for launching a new product and the life time of a product.

Among numerous electronic products, the video multimedia product is the most popular one, while after launching digital cameras, digital camcorders and image scanners, the image digitization has become the necessary trend. The key component and sub-assembly for the above-mentioned video multimedia products is the image sensor. In fact, the image sensor is a semiconductor chip which is able to convert an optical signal into an electronic signal and includes a photo-sensing component, for example, a complementary metal-oxide semiconductor (CMOS). In order to facilitate expanding the CMOS image sensor market, the task that how to make the chip therein have the light-handiness and optimum efficiency is counted as one of the emphases for the future technology developments.

Among the chip packaging technologies, the flip-chip package technology is developed to adapt the light, slim, short and small tendency of a product and usually utilizes the surface array arrangement mode to dispose a plurality of pads on the active surface of a chip, wherein the pads are used to form bumps and the bumps are then used to electrically connect the chip to a substrate. Since the flip-chip package technology is able to be applied in a chip package with high pin count and has other advantages, such as having a less packaging area and shortened signal transmission paths, the flip-chip package technology has been broadly used in the chip packaging field currently.

In addition, to meet the electrical integration design requirement of a chip package, a plurality of passive components, such as capacitors, inductors and resistors, can be further disposed on the surface of a flip-chip packaged substrate. Moreover, the passive components can be electrically connected to the chip or other electronic components through the interconnection traces in the flip-chip packaged substrate. In other words, the chip can be electrically connected to the passive components through bumps and the interconnection traces in the flip-chip packaged substrate.

FIG. 1 is a diagram of a conventional image sensor package. Referring to FIG. 1, the image sensor 1 mainly includes a substrate 10, a plurality of passive components 11, a chip 12 and a lens module 13.

The substrate 10 has an upper surface 101 and a lower surface 102, and the passive components 11 are disposed on the lower surface 102 of the substrate 10 by using a surface mount technology (SMT). After that, a wire bonding procedure is performed on the chip 12 and the substrate 10 so as to electrically connect them to each other, wherein the chip 12 has a photo-sensing component. In the end, the lens module 13 is assembled with and disposed on the substrate 10, and the lens module 13, the substrate 10 and the chip 12 together form a closure space. By this way, when entering into the lens of the lens module 13 and travelling through the lens module 13, the light would irradiate the photo-sensing component, and the action of the light on the photo-sensing component is able to generate an electrical signal.

In consideration of the current trend of the overall dimension of a package to be smaller, while more passive components are disposed therein, the above-mentioned prior art disposing the passive components on the lower surface of the substrate may suffer an inferior flatness on the lower surface of the substrate, which further leads to the signal-testing problem during the final stage of a package process. Thus, the testing yield of the whole package is affected.

In order to solve the problems of the excess number of the passive components and the unflatness on the lower surface of the substrate, an alternative conventional scheme was provided to dispose the passive components on the side edges of the substrate. However, the proposed scheme does not exactly solve the above-mentioned problem since the design scheme to dispose the passive components on the side edges still enlarges the substrate of the package.

In fact, people engaged in fabricating and developing image sensors keep efforts to improve the passive component technique and look forward to solve the unflatness problem in the prior art wherein the passive components are disposed on the lower surface of the CCM substrate with the goal to achieve a good and stable testing yield during testing the CCM image sensor.

SUMMARY OF THE INVENTION

The present invention is directed to an image sensor package applied in a CMOS camera module (CCM), wherein the unflatness problem caused by the passive components disposed on the lower surface of the substrate in the image sensor package is solved by additionally disposing a bottom cover.

As embodied and broadly described herein, the image sensor package of the present invention includes a substrate, a chip, a plurality of passive components, a lens module and a bottom cover. Herein the substrate has an upper surface and a lower surface and the chip is disposed on the upper surface of the substrate and the plurality of the passive components is disposed on the lower surface of the substrate. The lens module is disposed on and covers the substrate and defines a first containing space, wherein the chip is located. The bottom cover is connected to the lower surface of the substrate and defines a second containing space, wherein the passive components are located in the second containing space.

In an embodiment of the present invention, the passive components are disposed on and are electrically connected to the lower surface of the substrate by using surface mount technology.

In an embodiment of the present invention, the chip is electrically connected to the upper surface of the substrate by wire bonding or by flip-chip bonding.

In an embodiment of the present invention, the lens module includes a lens barrel, a lens and a lens housing, wherein the lens housing is mounted on the substrate and carries the lens barrel and the lens barrel supports the lens. When passing through the lens and irradiates the chip, the light is converted into an electrical signal by the chip.

In an embodiment of the present invention, the chip further includes a photo-sensing component to respond to light. The photo-sensing component can be a complementary metal-oxide semiconductor (CMOS) or a charge coupling device (CCD).

In an embodiment of the present invention, the lens module further includes a filter disposed between the lens and the chip. The filter can be a glass or an infrared low pass filter.

The present invention is further directed to an image sensor package including a lens module, a substrate and a connector. Herein, a containing space is disposed on the bottom of the lens module, an opening is formed on a side of the lens module, a chip is disposed on the upper surface of the substrate and a plurality of passive components is disposed on the lower surface of the substrate, wherein the substrate can be inserted into the containing space and the connector is combined with the opening to package the substrate within the lens module.

In another embodiment of the present invention, the image sensor package further includes sealant disposed between the connector and the opening of the lens module, so as to adhere the opening to the connector.

In another embodiment of the present invention, the passive components are disposed on and electrically connected to the lower surface of the substrate by using surface mount technology.

In another embodiment of the present invention, the chip is electrically connected to the upper surface of the substrate by wire bonding or by flip-chip bonding.

In another embodiment of the present invention, the connector can be electrically connected to an external printed circuit board (PCB).

In another embodiment of the present invention, the chip further includes a photo-sensing region facing the lens module for the chip to respond to light.

In another embodiment of the present invention, the lens module further includes a filter disposed between the lens and the chip. The filter can be a glass or an infra-red low pass filter.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
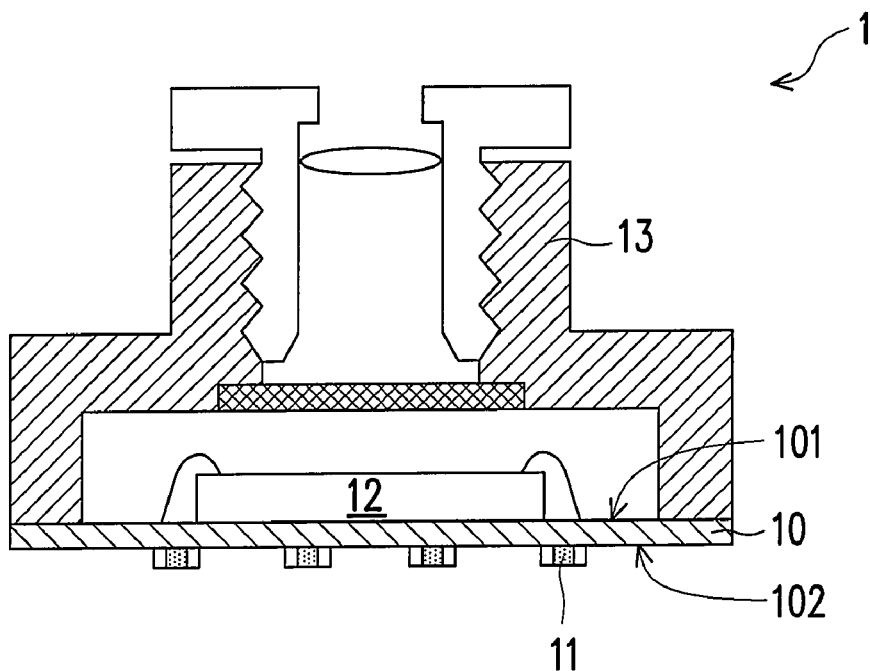
FIG. 1 shows a conventional image sensor package.

The present invention discloses an image sensor package applied in a CMOS camera module (CCM), wherein the unflatness problem caused by the passive components disposed on the lower surface of the substrate in the image sensor package is solved by additionally disposing a bottom cover, which further improves the testing yield of the image sensor package. The detail depiction of the present invention is given hereinafter.

The First Embodiment

FIGS. 2A-2D show an image sensor package applied in a CMOS camera module (CCM) according to the present invention. As shown in the figures, a package of an image sensor 2 includes a substrate 20, a chip 22, a plurality of passive components 21, a lens module 23, and a bottom cover 24. Herein the substrate 20 has an upper surface 201 and a lower surface 202. The chip 22 is disposed on the upper surface 201 of the substrate 20, while the plurality of passive components 21 is disposed on the lower surface 202 of the substrate 20. The lens module 23 is mounted on the substrate 20 and defines a first containing space 203. The chip 22 is located in the first containing space 203 and the bottom cover 24 connects the lower surface 202 of the substrate 20 to define a second containing space 204, wherein the passive components 21 are located in the second containing space 204.

Figure 2A:
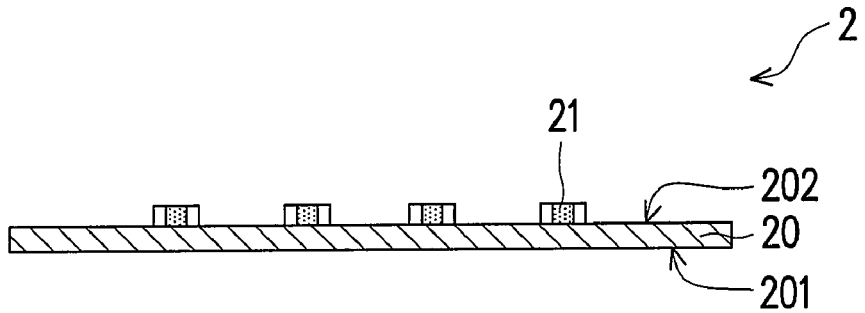
FIG. 2A shows passive components of an image sensor package of the present invention disposed on the substrate.

To meet the electrical integration design requirement of a chip package, a plurality of passive components 21, such as capacitors, inductors and resistors, are usually disposed on the lower surface 202 of the substrate 20 and electrically connected to the substrate 20 by using surface mount technology (SMT), as shown in FIG. 2A. Moreover, the passive components 21 can be electrically connected to the chip or other electronic components through the interconnection traces in the flip-chip packaged substrate and a contact.

Figure 2B:
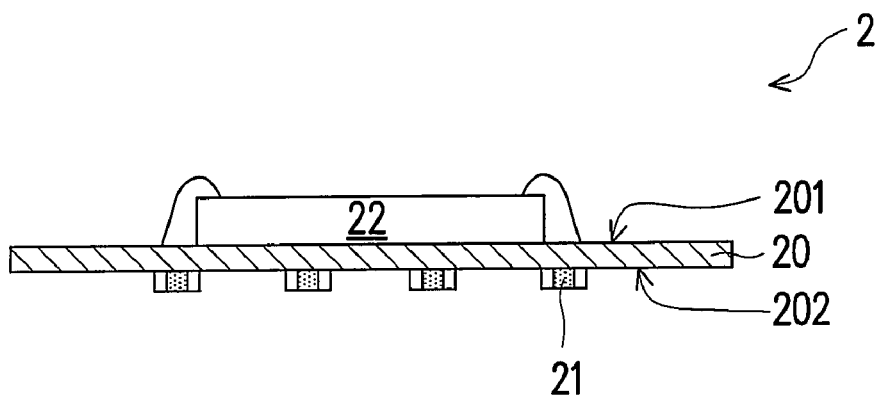
FIG. 2B shows the chip of an image sensor package of the present invention disposed on the substrate.

Referring to FIG. 2B, the chip 22 is disposed on the upper surface 201 of the substrate 20. In other words, the chip 22 can be electrically connected to the passive components 21 through bumps and the interconnection traces of the flip-chip packaged substrate 20. In the embodiment, the chip 22 is electrically connected to the upper surface 201 of the substrate 20 by wire bonding.

Figure 2C:
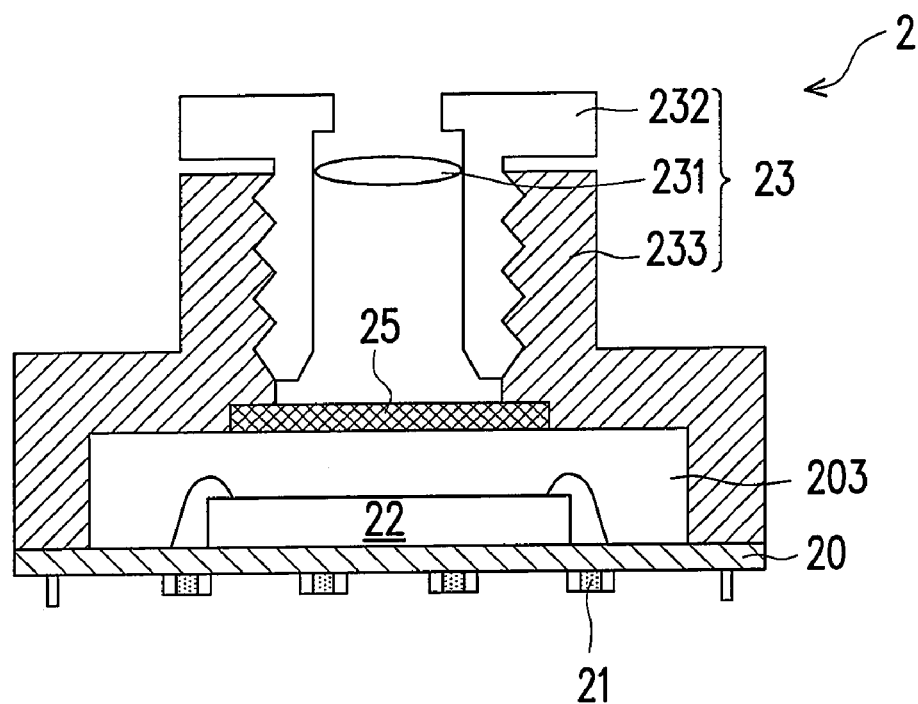
FIG. 2C shows the lens module of an image sensor package disposed on the substrate according to the first embodiment of the present invention.

Further referring to FIG. 2C, a lens module 23 is assembled with and mounted on the substrate 20 through an adhesive or other mechanical means, which are described specifically in the following paragraphs with FIGS. 2D and 2E. The lens module 23 of the embodiment includes a lens barrel 232, a lens 231 and a lens housing 233. The lens housing 233 is mounted on the substrate 20, the lens housing 233 carries the lens barrel 232 and the lens barrel 232 supports the lens 231. When passing through the lens and irradiating the chip 22, the light is converted into an electrical signal by the chip 22. Herein, the chip 22 further includes a photo-sensing component facing the lens module 23 for the chip 22 to respond to the light, and the photo-sensing component can be a CMOS or a CCD.

The lens module 23 further includes a filter 25 disposed between the lens 231 and the chip 22. The filter 25 can be a glass or an infrared low pass filter.

Figure 2D:
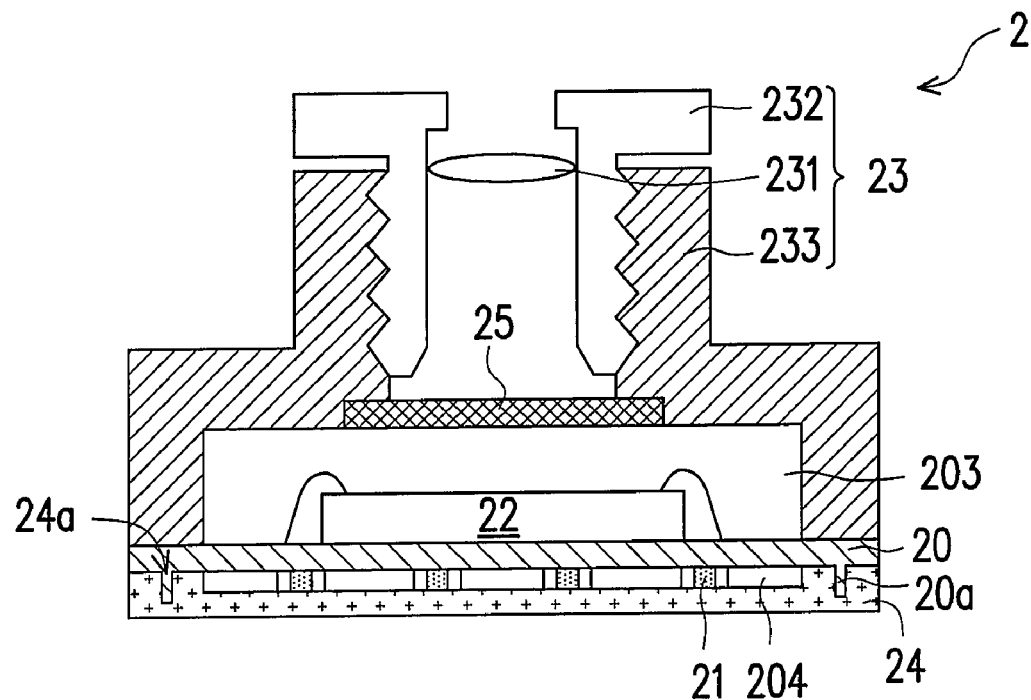
FIGS. 2D and 2E respectively show the bottom cover of an image sensor package disposed on the substrate through different means according to the first embodiment of the present invention.
Figure 2E:
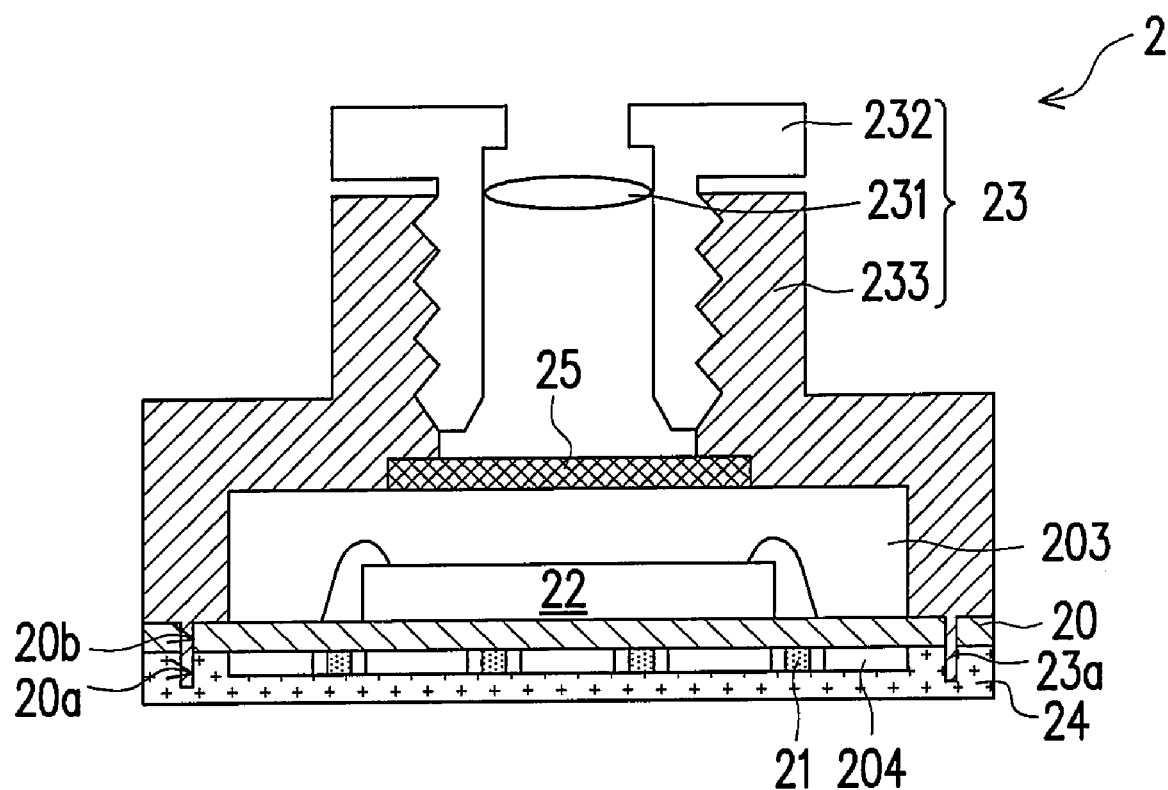

Furthermore, referring to FIG. 2D, the above-mentioned lens module 23 is disposed on the substrate 20 by adhesion to enclose the chip 22 and together with the substrate 20 to form the first containing space 203 which is a sealed space. Then, the bottom cover 24 is connected to the lower surface 202 of the substrate 20 to enclose the passive components, wherein the bottom portion of the bottom cover 24 should provide a flat bottom surface, and the bottom cover has a short cup-like structure. The bottom side edges of the short cup-like structure respectively has a positioning hole 24a, and preset hooks 20a disposed on the bottom of the substrate 20 can be inserted into the positioning hole 24a. In this way, the bottom cover 24 is attached to the substrate 20, and the lower surface 202 of the substrate 20 forms the second containing space 204 together with the bottom cover 24. The lens module 23 herein is an automatic focusing lens module and includes an automatic focusing driver disposed inside the second containing space 204.

Moreover, the lens module 23 can further be mounted on the substrate 20 through other mechanical means. Referring to FIG. 2E, the substrate 20 may have a first positioning hole 20b and the lens module 23 has a corresponding positioning pin 23a; the lens module 23 is disposed on the substrate 20 by inserting the positioning pin 23a into the first positioning hole 20b. The bottom cover 24 further has a second positioning hole 24a, and the lens module 23, the substrate 20 and the bottom cover 24 are fixed together by further inserting the positioning pin 23a to pass the first positioning hole 20b and inserting the positioning pin 23a into the second positioning hole 24a.

The Second Embodiment

FIGS. 3A-3D show the package of another image sensor 3 applied in a CCM according to the present invention. As shown by the diagrams, a package of the image sensor includes a lens module 33, a substrate 30 and a connector 303, wherein a containing space is disposed in the bottom portion of the lens module 33. An opening is made on a side of the bottom portion of the lens module 33. A chip 32 is disposed on the upper surface 301 of the substrate 30 and a plurality of passive components 31 is disposed on the lower surface 302 thereof, wherein the substrate 30 can be inserted into the containing space and the connector 303 fits the opening so as to package the substrate 30 inside the lens module 33.

Figure 3A:
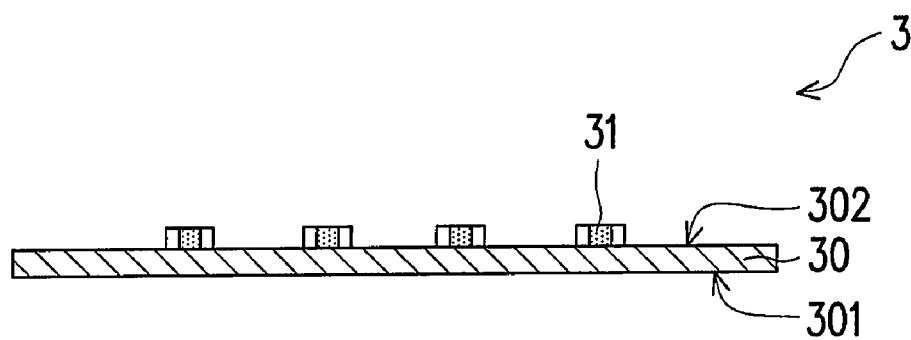
FIG. 3A shows the passive components of an image sensor package disposed on the substrate according to the second embodiment of the present invention.

As mentioned in the first embodiment, in order to meet the electrical integration design requirement of a chip package, referring to FIG. 3a, the substrate 30 usually has an upper surface 301 and a lower surface 302, and a plurality of passive components 31 is disposed on and electrically connected to the lower surface 302 of the substrate 30 by using SMT. The passive components 31, such as capacitors, inductors and resistors, are electrically connected to the chip 32 or other electronic components through the interconnection traces in the flip-chip packaged substrate.

Figure 3B:
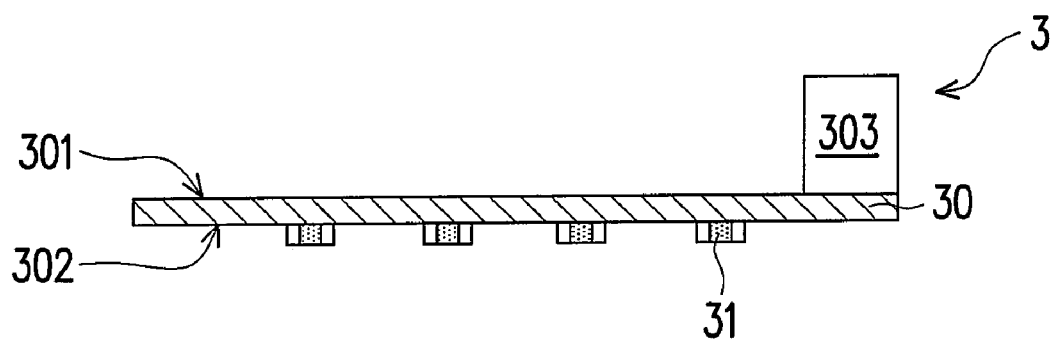
FIG. 3B shows the connector of an image sensor package disposed on the substrate according to the second embodiment of the present invention.

Further referring to FIG. 3b, the connector 303 is disposed on a side portion of the upper surface 301 of the substrate 30, and the connector 303 can be a connector with flexible printed circuit board (FPCB).

Figure 3C:
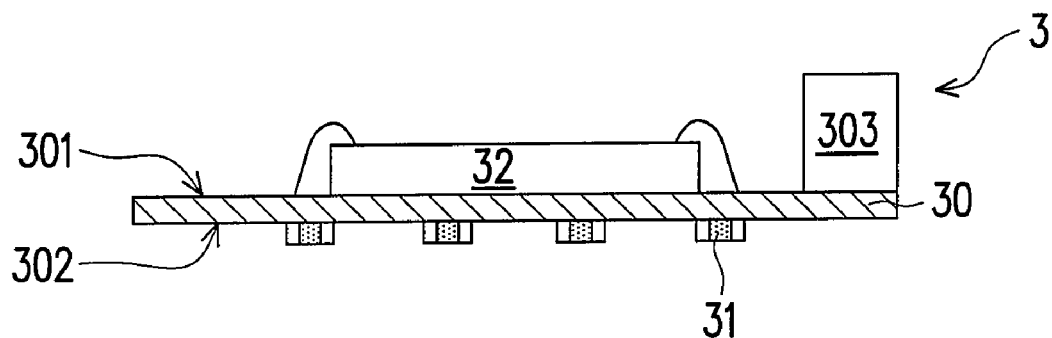
FIG. 3C shows the chip of an image sensor package disposed on the substrate according to the second embodiment of the present invention.

Furthermore referring to FIG. 3c, the chip 32 is disposed on the upper surface 301 of the substrate 30. In other words, the chip 32 can be electrically connected to the passive components 31 through bumps and the interconnection traces in the flip-chip packaged substrate. In the embodiment, the chip 32 is electrically connected to the upper surface 301 of the substrate 30 by wire bonding.

Figure 3D:
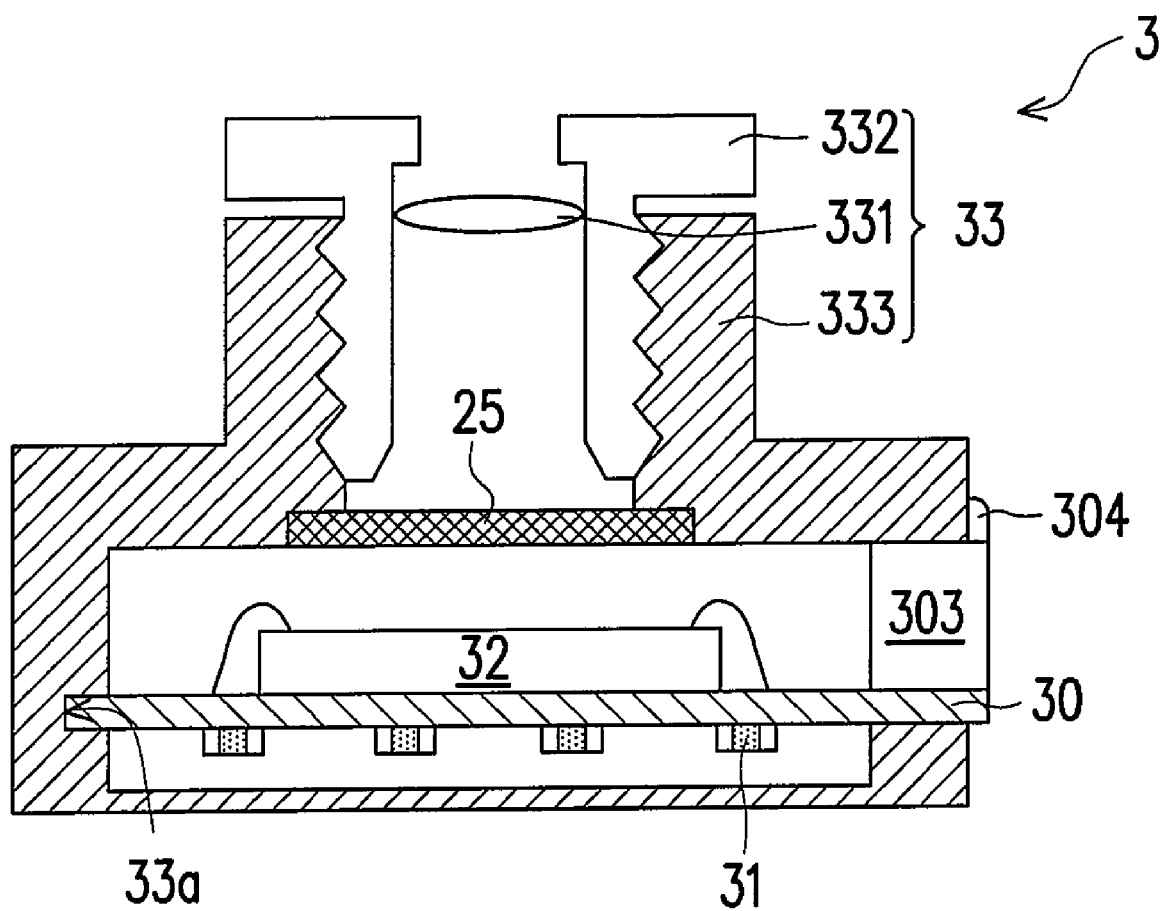
FIG. 3D shows the lens module of an image sensor package disposed on the substrate according to the second embodiment of the present invention.

Referring to FIG. 3d, a containing space is disposed in the bottom portion of the lens module 33 and an opening is formed on a side of the bottom portion of the lens module 33, wherein the opening is for fitting the connector 303 on the substrate 30, so that the substrate 30 is able to be inserted into the containing space. After the connector 303 is fitted with the opening, the substrate 30 is packaged in the lens module 33. The passive components 31 on the lower surface 302 can also be enclosed and located inside the containing space of the bottom portion. In addition, the lens module 33 further includes a slot 33a and the substrate 30 is inserted into the slot 33a.

In the embodiment, the lens module 33 includes a lens barrel 332, a lens 331 and a lens housing 333. A containing space is disposed in the bottom portion of the lens housing 333, and an opening is formed on a side of the bottom portion of the lens module 33 to connect the connector 303. The lens housing 333 carries the lens barrel 332 and the lens barrel 332 supports the lens 331. When passing through the lens and irradiating the chip 32, the light is converted into an electrical signal by the chip 32. Herein, the chip 32 further includes a photo-sensing region facing the lens module 33 for the chip 32 to respond to the light. The photo-sensing region can be a CMOS or a CCD.

The lens module 33 further includes a filter 35 disposed between the lens 331 and the chip 32. The filter 35 can be a glass or an infrared low pass filter.

A sealant 304 is disposed between the connector 303 and the opening of the lens module 33, so as to adhere the opening to the connector 303. The sealant 304 can be the ultraviolet-curing resin. Besides, the connector 303 can be electrically connected to an external printed circuit board (PCB) (not shown).

In summary, in comparison with a conventional image sensor, the image sensor of the present invention is capable of solving the unflatness problem caused by the passive components disposed on the lower surface of the substrate. The image sensor of the present invention further solves the testing yield problem during testing the signals of the image sensor. In the first embodiment of the present invention, a bottom cover is disposed on the bottom of the image sensor to enclose the passive components so as to keep the flatness of the bottom surface of the image sensor, which is helpful to maintain a good electrical connection during testing and accordingly avoids a poor testing yield. In the second embodiment of the present invention, the substrate and the passive components are inserted and located into the lens module through an opening formed thereon, wherein the opening is for fitting an electronic device, such as a connector on the substrate, so as to enclose the containing space by the electronic device. In this way, the second embodiment of the present invention is able to maintain the flatness of the bottom surface of the image sensor as well. In short, the present invention overcomes the problems accompanied with the above-mentioned prior art.

In addition, it should be noted, in comparison with the prior art where the passive components are disposed on the side edges of the substrate to solve the problem of disposing excess number passive components and the unflatness problem of the lower surface of the substrate but resulting in a new problem of enlarging the substrate dimension of the package, the present invention provides an image sensor with a feasible solution to solve the unflatness problem of the lower surface of the substrate without causing the problem of enlarging the structure dimension thereof.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An image sensor package, comprising:
   a substrate, having an upper surface and a lower surface;
   a chip, disposed on the upper surface of the substrate;
   a plurality of passive components, disposed on the lower surface of the substrate;
   a lens module, mounted on the substrate and defining a first containing space, wherein the chip is located in the first containing space; and
   a bottom cover, connected to the lower surface of the substrate and defining a second containing space, wherein the passive components are located in the second containing space.

2. The image sensor package according to claim 1, wherein the lens module comprises a lens barrel, a lens and a lens housing, the lens housing is mounted on the substrate and carries the lens barrel, and the lens barrel supports the lens.

3. The image sensor package according to claim 1, wherein the lens module further comprises a filter disposed between the lens and the chip.

4. The image sensor package according to claim 3, wherein the filter is a glass or an infrared low pass filter.

5. The image sensor package according to claim 1, wherein the substrate further comprises an external contact.

6. The image sensor package according to claim 1, wherein the lens module is an automatic focusing lens module.

7. The image sensor package according to claim 1, further comprising an automatic focusing driver disposed in the second containing space.

8. The image sensor package according to claim 1, wherein the substrate has a first positioning hole, the lens module has a corresponding positioning pin and the lens module is disposed on the substrate by inserting the positioning pin into the first positioning hole.

9. The image sensor package according to claim 8, wherein the bottom cover further has a second positioning hole, the positioning pin passes through the first positioning hole and fits the second positioning hole to fix the lens module, the substrate and the bottom cover together.

10. The image sensor package according to claim 1, wherein the substrate has a preset hook, the bottom cover further has a corresponding positioning hole and the preset hook fits the positioning hole to fix the substrate and the bottom cover together.

11. The image sensor package according to claim 10, wherein the lens module is mounted on the substrate through an adhesive.

12. An image sensor package, comprising:
    a lens module, wherein a containing space is disposed in a bottom portion of the lens module and an opening is disposed on a side of the lens module;
    a substrate, wherein a chip is disposed on an upper surface of the substrate and a plurality of passive components are disposed on a lower surface of the substrate and the substrate is able to be inserted into the containing space; and
    a connector, fitting the opening to package the substrate inside the lens module.

13. The image sensor package according to claim 12, further comprising a sealant disposed between the connector and the opening of the lens module.

14. The image sensor package according to claim 12, wherein the connector is electrically connected to an external printed circuit board (PCB).

15. The image sensor package according to claim 12, wherein the lens module comprises a lens barrel, a lens and a lens housing, the lens housing is mounted on the substrate and carries the lens barrel, and the lens barrel supports the lens.

16. The image sensor package according to claim 12, wherein the lens module further comprises a filter disposed between the lens and the chip.

17. The image sensor package according to claim 16, wherein the filter is a glass or an infrared low pass filter.

18. The image sensor package according to claim 12, wherein the lens module further comprises a slot and the substrate is inserted into the slot.

* * * * *